United States Patent [19]
Cherichetti et al.

[11] Patent Number: 5,954,824
[45] Date of Patent: *Sep. 21, 1999

[54] TEST MODE MATRIX CIRCUIT FOR AN EMBEDDED MICROPROCESSOR CORE

[75] Inventors: Cory Ansel Cherichetti, Burlington; Peter Stewart Colyer, Essex Junction; David Robert Stauffer, Milton, all of Vt.

[73] Assignee: International Business Machines Corporation, Armonk, N.Y.

[ * ] Notice: This patent is subject to a terminal disclaimer.

[21] Appl. No.: 08/927,236

[22] Filed: Sep. 11, 1997

Related U.S. Application Data

[62] Division of application No. 08/511,943, Aug. 7, 1995, Pat. No. 5,724,502.

[51] Int. Cl.$^6$ .................................................. G06F 11/00
[52] U.S. Cl. ............................. 714/28; 714/724; 307/407
[58] Field of Search ........................ 395/183.04, 183.01, 395/183.06; 371/25.1, 22.5, 22.6; 364/267.91, 550, 578, 927.81; 714/28, 25, 30, 736, 733, 734; 307/407, 412

[56] References Cited

U.S. PATENT DOCUMENTS

| | | | |
|---|---|---|---|
| 4,404,519 | 9/1983 | Westcott | 324/73 R |
| 4,542,508 | 9/1985 | Moore | 371/29 |
| 4,764,896 | 8/1988 | Freimark et al. | 364/900 |
| 4,910,735 | 3/1990 | Yamashita | 371/22.4 |
| 4,947,395 | 8/1990 | Bullinger et al. | 371/22.3 |
| 4,964,033 | 10/1990 | Williams | 364/200 |
| 4,975,641 | 12/1990 | Tanaka et al. | 324/158.1 |
| 5,012,180 | 4/1991 | Dalrymple et al. | 324/73.1 |
| 5,049,814 | 9/1991 | Walker, III et al. | 324/73.1 |
| 5,214,584 | 5/1993 | Dingee et al. | 364/423 |
| 5,254,940 | 10/1993 | Oke et al. | 324/158.1 |
| 5,304,860 | 4/1994 | Ashby et al. | 307/296.3 |
| 5,331,571 | 7/1994 | Aronoff et al. | 364/578 |
| 5,339,262 | 8/1994 | Rostoker | 364/578 |
| 5,347,181 | 9/1994 | Ashby et al. | 307/465 |
| 5,379,308 | 1/1995 | Nhuyen et al. | 371/22.6 |
| 5,381,530 | 1/1995 | Thayer et al. | 395/275 |
| 5,392,297 | 2/1995 | Bell et al. | 371/22.6 |
| 5,404,359 | 4/1995 | Gillenwater et al. | 371/22.5 |
| 5,477,545 | 12/1995 | Huang | 371/22.3 |
| 5,534,774 | 7/1996 | Moore et al. | 371/25.1 X |
| 5,604,432 | 2/1997 | Moore et al. | 324/158.1 |
| 5,799,021 | 8/1998 | Gheewala | 371/22.1 |

Primary Examiner—Dieu-Minh T. Le
Attorney, Agent, or Firm—Schmeiser, Olsen & Watts; Robert A. Walsh

[57] ABSTRACT

A test mode matrix circuit in an integrated circuit switches signal lines internal to the integrated circuit in a manner that allows an embedded microprocessor within the integrated circuit to be fully functionally tested using standard test vectors applied to the integrated circuit, and which allows for debugging the code written for an embedded microprocessor core by connecting an in-circuit emulator (ICE) to the integrated circuit. The test mode matrix circuit operates in a number of mutually exclusive modes, each of which is suitably selected via control signal inputs to the test mode matrix. The test mode matrix circuit couples signals from the embedded microprocessor to the application-specific logic without passing through off-chip drivers/receivers. Multiple microprocessors and corresponding test mode matrices may also be implemented on the same integrated circuit.

10 Claims, 6 Drawing Sheets

TEST MODE MATRIX CIRCUIT FOR AN EMBEDDED MICROPROCESSOR CORE

RELATED APPLICATION

This application is a continuation of an earlier patent application by Cherichetti et al., entitled "TEST MODE MATRIX CIRCUIT FOR AN EMBEDDED MICROPROCESSOR CORE", U.S. Pat. No. 5,724,502, filed Aug. 7, 1995, and is incorporated herein by reference.

BACKGROUND OF THE INVENTION

1. Technical Field

This invention generally relates to integrated circuits, and more specifically relates to application-specific integrated circuits (ASICs) which have one or more embedded microprocessor cores, which allow for testing the microprocessor core with standard test vectors, and which allow for using an in-circuit emulator (ICE) in debugging the software for each microprocessor core.

2. Background Art

Modern electronic systems often incorporate embedded microprocessors or microcontrollers. With the push for higher levels of integration and performance, the trend has been to embed a microprocessor or microcontroller (referred to hereinafter generically as "microprocessor) within an application specific integrated circuit (ASIC). The resulting ASIC contains the microprocessor "core" plus application-specific logic packaged on a single chip.

Since the microprocessor core within an ASIC typically interfaces only to logic within the ASIC, it is typically not necessary during normal operation to connect input/output (I/O) signals from the microprocessor core to the primary I/O (i.e., off-chip) drivers/receivers of the ASIC. However, when microprocessor I/O is not accessible outside of the ASIC chip, the microprocessor core within the ASIC becomes much more difficult to test. Typically, stand-alone microprocessors are tested by applying a set of test vectors to the inputs, and monitoring the outputs for expected responses. These sets of test vectors are often referred to as Architectural Verification Patterns (AVPs). When the microprocessor is embedded within ASIC logic, it is no longer possible to use the AVPs developed for the stand-alone microprocessor. New AVPs, which account for the behavior of the embedded microprocessor plus the application-specific logic, could be developed. However, this would require new and unique AVPs for each ASIC. The development of AVPs for a semiconductor device is a very expensive and time-consuming process, and generating new AVPs for each ASIC device would thus substantially increase the development costs for each device. It is therefore desirable to provide a way to test a microprocessor core implemented within an ASIC using the standard AVPs developed for the stand-alone microprocessor.

Another complication that results from embedding a microprocessor core in an ASIC relates to the testing of the software that runs on the embedded microprocessor core. Typically, software for microprocessors is tested and integrated with the hardware using a test tool called an in-circuit emulator (ICE). An ICE typically has connection points which are coupled to the connections points of the microprocessor, and which emulates microprocessor operation while providing advanced debugging capabilities. A stand-alone microprocessor may thus be removed in an embedded system and replaced with an ICE during the debugging of the system hardware and software. However, when a microprocessor is implemented within an ASIC, the connection points to the microprocessor are buried within the ASIC logic. One way to use an ICE with a microprocessor embedded within an ASIC is to bring all the microprocessor I/O to external I/O pins on the ASIC device. However, for most applications, the majority of microprocessor I/O signals are not needed at the external I/O pins during normal operation. Adding all the microprocessor I/O signals as I/O pins on the ASIC device, which are used only during development of the ASIC, would greatly increase the packaging size for the ASIC, thereby substantially increasing its cost. This method of providing external I/O pins on an ASIC for using an ICE with an embedded microprocessor generally is not a cost-effective solution. In addition, for applications that require two or more embedded microprocessor cores within an ASIC, providing all the appropriate microprocessor I/O signals on external I/O pins would result in an unworkable number of I/O pins.

Various architectures are known for embedding a microprocessor core within an ASIC. For example, U.S. Pat. No. 5,254,940 "Testable Embedded Microprocessor and Method of Testing Same" (issued Oct. 19, 1993 to Oke et al. and assigned to LSI Logic Corp.) discloses a method of embedding a microprocessor core such that microprocessor I/O are driven off-chip only when the ASIC is configured into a special test mode. FIG. 1 herein is a reproduction of FIG. 2 in the Oke et al. patent. During normal operation, chip output pads 214 are used for signals to/from the application-specific logic. This circuit 200 permits the embedded microprocessor 204 to be tested using the standard AVPs developed for the stand-alone microprocessor. The Oke et al. circuit is limited, however, in that an ICE cannot be substituted for the embedded microprocessor. In addition, the Oke et al. circuit is limited to unidirectional signals, and does not provide a solution for bidirectional I/O lines.

Another design for embedding a microprocessor within an ASIC is described in U.S. Pat. No. 5,304,860 "Method for Powering Down a Microprocessor Embedded within a Gate Array" (issued Apr. 19, 1994 to Ashby et al. and assigned to Motorola, Inc.). FIG. 2 herein is a reproduction of FIG. 7 of the Ashby et al. patent. The Ashby et al. patent describes a method of embedding the microprocessor core such that the embedded microprocessor core and the application-specific logic can be isolated from each other. The circuit of Ashby et al. permits the embedded microprocessor core to be tested using standard AVPs, and permits the connection of an ICE to emulate the embedded microprocessor. The circuit is limited, however, in making all microprocessor I/O signals coupled to the application-specific logic accessible to I/O pins during all modes of operation. The increased I/O pin requirement typically increases the size of the chip, the size of the package, and hence the cost of the ASIC. The problem of excessive pinout becomes even more significant for ASICs that have more than one embedded microprocessor core. Another significant disadvantage is that all connections between the embedded microprocessor and the application-specific logic is always via an off-chip driver 54 and matching receiver 58. The propagation delay of an off-chip driver and receiver is much greater than the propagation delay of on-chip signals. Thus, making all connections between the microprocessor core and the application-specific logic through off-chip drivers and receivers imposes a significant performance limitation due to increased propagation delays.

Another relevant architecture for an integrated circuit that includes an embedded microprocessor is disclosed in U.S. Pat. No. 5,331,571 "Testing and Emulation of Integrated Circuits" (issued Jul. 19, 1994 to Aronoff et al. and assigned to NEC Electronics, Inc.). The three patents listed above are incorporated herein by reference. The Aronoff et al. circuit allows for testing an embedded microprocessor, but requires internal three-state busses (i.e., three-state busses which connect logic entirely inside the chip). Internal three-state busses do not allow for complete testability of the integrated circuit. For example, if a three-state driver is turned off when it should be turned on, its output may still float to a logic state that is indicative of a functioning circuit, thereby masking defects in the integrated circuit.

Therefore, there existed a need to provide an integrated circuit, such as an ASIC, with an embedded microprocessor core that allows for the microprocessor core to be tested using standard AVPs developed for the stand-alone microprocessor, that allows for an ICE to be used to emulate the embedded microprocessor core, that couples the microprocessor core directly to the application-specific logic without passing through off-chip drivers and receivers, and that contains no three-state devices to assure complete testability.

DISCLOSURE OF INVENTION

According to the present invention, a test mode matrix circuit for an integrated circuit such as an ASIC is provided which controls the routing of signals on the integrated circuit device. The function of the test mode matrix circuit is determined by the state of control inputs. When the control inputs are configured for normal operation, the application-specific logic is coupled directly to the microprocessor core without passing through off-chip I/O drivers/receivers. In addition, in normal mode, various signals from the application-specific logic are coupled to the I/O drivers/receivers. When the control inputs are configured for AVP operation, the microprocessor core I/O signals are coupled directly to the I/O drivers/receivers to allow an external tester to apply standard AVPs developed for a stand-alone microprocessor to the embedded microprocessor core. When the control inputs are configured for ICE operation, the application-specific logic signals which are coupled to the microprocessor core during normal operation are coupled instead to the I/O drivers/receivers, allowing an external ICE to emulate the functions of the embedded microprocessor core during debugging of the application-specific logic and the microprocessor core software. The control inputs may also define other modes of operation, such as allowing scan testing of the integrated circuit during manufacturing. In addition, the test mode matrix contains no three-state devices, allowing for complete testability of the integrated circuit.

The foregoing and other objects, features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
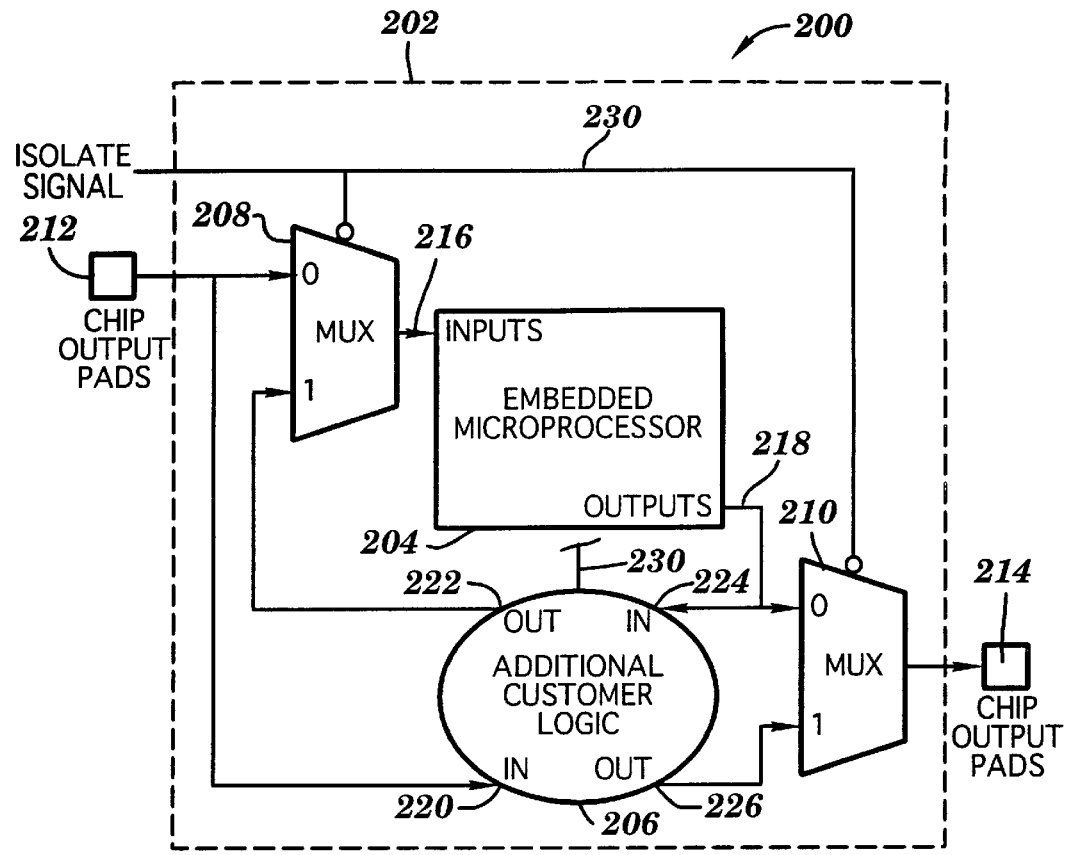
FIG. 1 is a block diagram of a prior art circuit for selectively coupling signals from a microprocessor core and signals from application-specific logic to chip output pads 214 of an ASIC.
Figure 2:
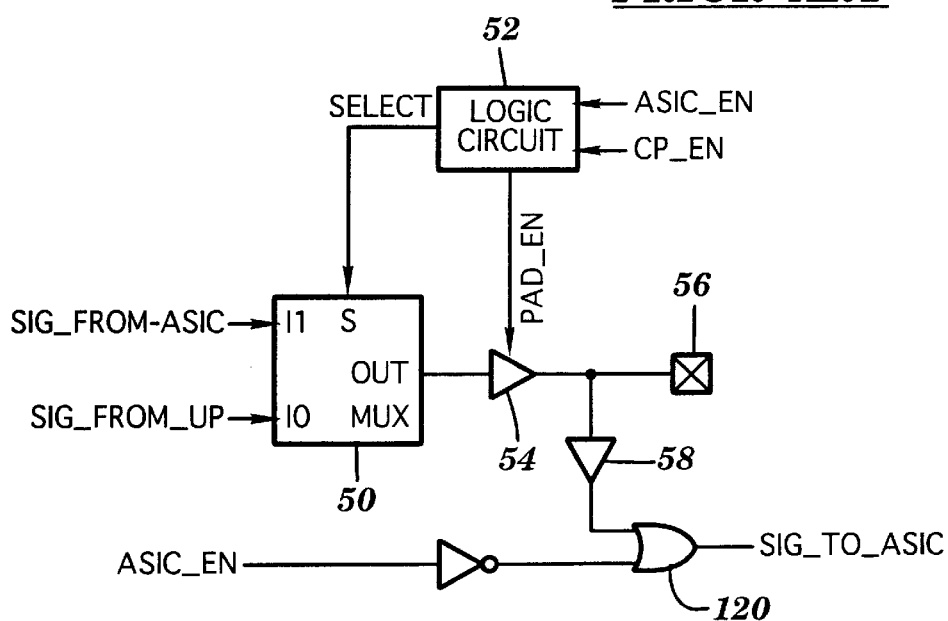
FIG. 2 is a prior art circuit for selectively coupling signals from a microprocessor core and signals from application-specific logic to I/O pads 56 of an ASIC, and for coupling signals from the microprocessor core through I/O drivers 54 and receivers 58 to the application-specific logic.
Figure 3:
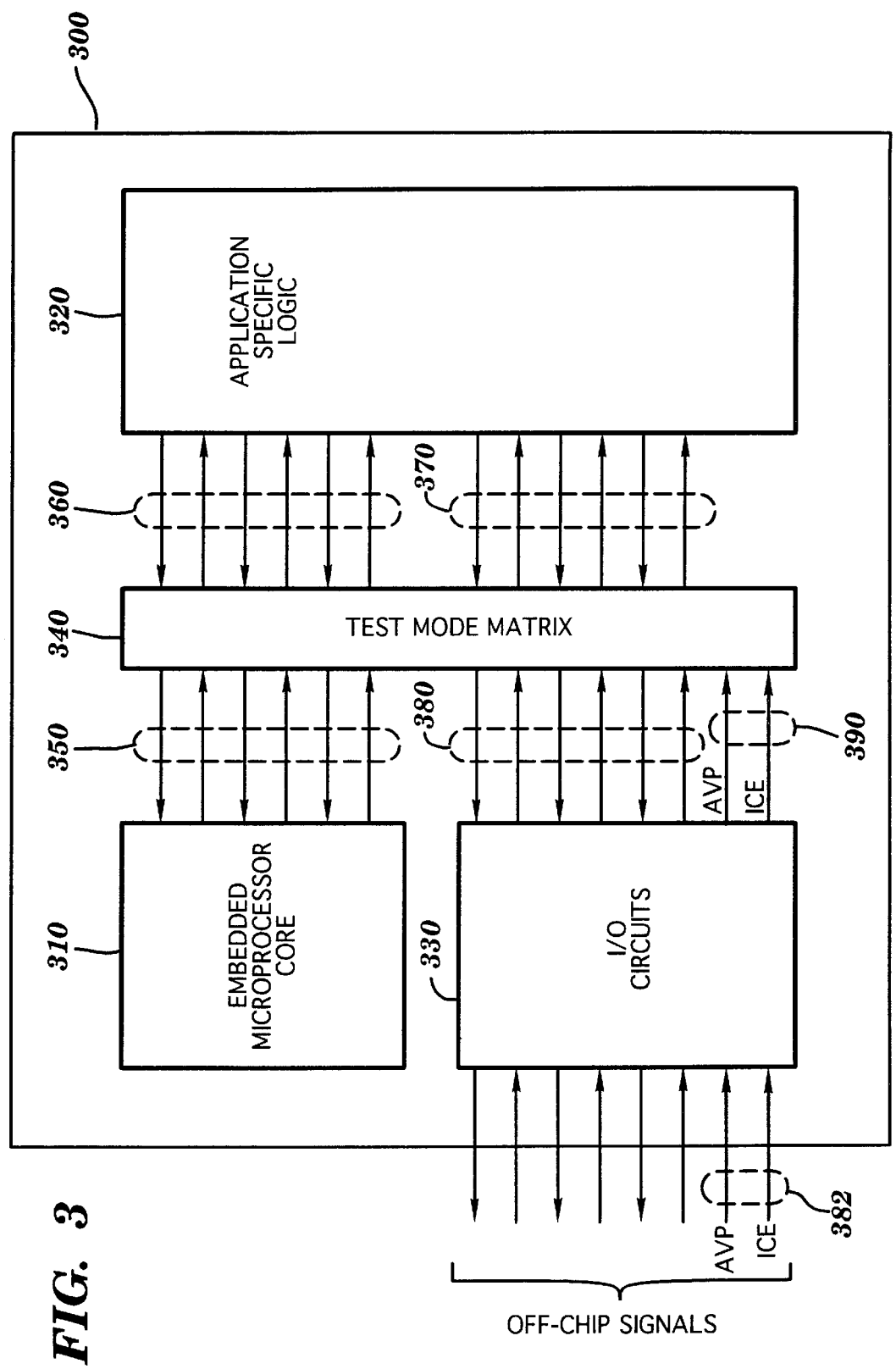
FIG. 3 is a block diagram of an ASIC implementing the test mode matrix in accordance with a first embodiment of the present invention.

Referring to FIG. 3, an integrated circuit, such as ASIC 300, in accordance with a first embodiment of the present invention comprises a microprocessor core 310, application-specific logic 320, I/O circuits 330, and a test mode matrix 340. Test mode matrix 340 interconnects microprocessor core 310, application-specific logic 320, and I/O circuits 330 in a manner that allows testing microprocessor core 310 using standard test vectors by coupling an external tester to I/O circuits 330; that allows system testing and debugging of the application-specific logic 320 and code for the microprocessor core 310 by connecting an in-circuit emulator (ICE) to I/O circuits 330; and that further allows for normal circuit operation. Test mode matrix 340 makes the required connections without routing any of the signals between microprocessor core 310 and application-specific logic 320 through off-chip driver/receivers located within I/O circuits 330, and without routing any of these signals through three-state devices, allowing for a high level of performance while maintaining complete testability of the ASIC.

Microprocessor core 310 executes code and controls application-specific logic 320 to cause ASIC 300 to perform its desired function. Microprocessor core 310 is any suitable microprocessor core which may be implemented within the ASIC. Application-specific logic 320 is an array of logic designed and configured to interact with microprocessor core 310. I/O circuits 330 provide all the off-chip drivers and receivers to interface ASIC 300 to external devices. The operation of ASIC 300 depends on the state of control signals 382, shown for illustrative purposes in FIG. 3 as AVP and ICE. These control signals 382 pass through I/O circuits 330 and signals 390 to test mode matrix 340, which varies its function according to the specific mode selected via control signals 382.

For the specific implementation shown in FIG. 3, the two binary control signals 382 (AVP, ICE) provide for four different modes of operation. In a first mode of operation, AVP and ICE are both de-asserted, causing normal operation of ASIC 300. In a second mode of operation, AVP is asserted while ICE is de-asserted, causing ASIC 300 to enter a special test mode referred to herein as "AVP mode", which allows microprocessor core 310 to be tested by applying standard test vectors to I/O circuits 330. In a third mode of operation, AVP is de-asserted while ICE is asserted, causing ASIC 300 to enter another special test mode referred to herein as "ICE mode", which allows application-specific logic 320 and code for microprocessor core 310 to be debugged by connecting an in-circuit emulator (ICE) to I/O circuits 330. In a fourth mode of operation, AVP and ICE are both asserted, causing ASIC 300 to enter another mode corresponding to a mode selected by the user. One example of an appropriate fourth mode allows scan testing of ASIC 300 during manufacturing.

The state of control signals 382 is reflected on inputs 390 of test mode matrix 340, causing test mode matrix 340 to make the appropriate connections for the selected mode. Test mode matrix 340 is bidirectional, and can therefore switch inputs, outputs, and bidirectional signals. In normal mode (e.g., when AVP and ICE are both de-asserted), test mode matrix 340 couples microprocessor I/O signals on bus 350 to a first set of application-specific logic I/O signals on bus 360, and couples a second set of application-specific logic I/O signals on bus 370 to bus 380, which are in turn coupled to I/O circuits 330. Note that the signals available off-chip (i.e., on bus 380 coupled to I/O circuits 330) are signals 370 from application-specific logic 320. The microprocessor I/O signals 350 will not necessarily be available off-chip, unless application-specific logic 320 internally routes some of the microprocessor I/O from bus 360 to bus 370. Thus, in normal mode, microprocessor core 310 may not be readily accessible for testing. However, microprocessor core 310 may always be tested using AVP mode.

In AVP mode (e.g., when AVP is asserted and ICE is de-asserted), test mode matrix 340 couples the microprocessor I/O signals on bus 350 to bus 380, causing all the microprocessor I/O signals to be accessible off-chip. AVP mode thus allows an external tester coupled to I/O circuits 330 to apply standard test vectors developed for a stand-alone microprocessor to test microprocessor core 310 within ASIC 300.

In ICE mode (e.g., when AVP is de-asserted and ICE is asserted), test mode matrix 340 couples the I/O signals on bus 360 to bus 380. In normal mode, bus 360 provides microprocessor I/O to application-specific logic 320. In ICE mode, an external in-circuit emulator (ICE) may be coupled to I/O circuits 330 to emulate microprocessor core 310. Coupling bus 380 to bus 360 necessarily implies that signals on bus 370 which are normally connected off-chip via bus 380 in normal mode are not available off-chip in ICE mode, since all off-chip I/O on bus 380 is coupled to application-specific logic 320 via bus 360. The impact of signals on bus 370 being unavailable in ICE mode may be minimized by judicious selection of which signals within application-specific logic 320 are coupled to bus 370.

Figure 4:
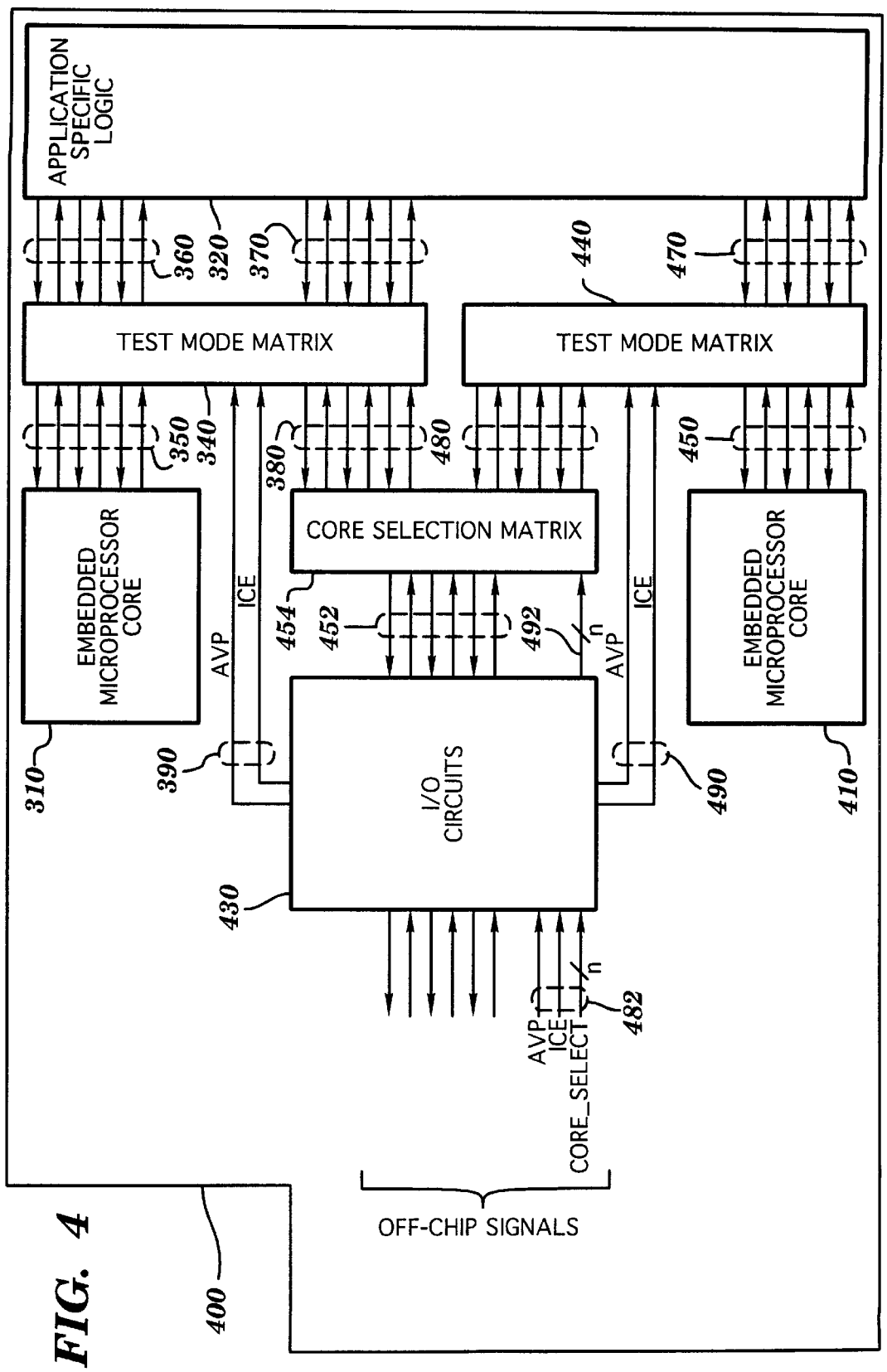
FIG. 4 is a block diagram of an ASIC implementing two test mode matrices in accordance with a second embodiment of the present invention.

Referring now to FIG. 4, an ASIC 400 in accordance with a second embodiment of the present invention suitably includes a microprocessor core 310, application-specific logic 320, and a test mode matrix 340 (similar to the implementation of the first embodiment), and in addition includes a second microprocessor core 410, a second test mode matrix 440, a core selection matrix 454, and I/O circuits 430. ASIC 400 in accordance with the second embodiment of the invention is used when multiple microprocessors are embedded in a single ASIC device. For illustrative purposes, the number of microprocessor cores in FIG. 4 is shown as two, but the present invention extends to any appropriate number of microprocessor cores embedded within an integrated circuit, such as an ASIC.

Core selection matrix 454 switches the signals on bus 380 to bus 452 when input 492 is in a first state, and switches the signals on bus 480 to bus 452 when input 492 is in a second state. The two states of input 492 correspond to the two states of the CORE_SELECT input, and core selection matrix 452 thus selects which bus (380 or 480) is coupled to I/O circuits 430.

Control signals 482 to I/O circuits 430 determine the mode of operation for ASIC 400, and suitably comprise an AVP signal and an ICE signal (as for the first embodiment shown in FIG. 3), and one or more CORE_SELECT signals. The state of control signals 482 is reflected on inputs 390 of test mode matrix 340, on inputs 490 of test mode matrix 440, and on inputs 492 of core selection matrix 454, which collectively cause the appropriate test mode matrix (340 or 440) and core selection matrix 454 to make the appropriate connections for the selected mode. Control signals 482 to ASIC 400 define similar modes as ASIC 300 (FIG. 3), namely, normal mode, AVP mode, ICE mode, and other modes (as required). However, control signals 482 must also provide AVP mode and ICE mode (and possibly one or more other modes) for both microprocessor cores 310 and 410. The AVP and ICE control signals function the same as for ASIC 300, while CORE_SELECT defines which microprocessor core (310 or 410) is selected.

In normal mode (e.g., when AVP and ICE are both de-asserted), test mode matrix 340 couples microprocessor I/O signals on bus 350 to a first set of application-specific logic I/O signals on bus 360, and couples a second set of application-specific logic I/O signals on bus 370 to bus 380. Core selection matrix 454, in response to control signal 492 being driven to an appropriate state in normal mode by I/O circuits 430, couples the signals on bus 380 to bus 452, which is coupled to I/O circuits 430. Note that the signals available off-chip (i.e., coupled to I/O circuits 430) are signals 370 from application-specific logic 320. In addition, in normal mode, test mode matrix 440 routes microprocessor I/O signals from bus 450 to bus 470. Bus 480 is inactive in normal mode, and is only used in test modes.

In AVP mode with microprocessor core 310 selected (e.g., when AVP is asserted, ICE is de-asserted, and CORE_SELECT is in a first state corresponding to core 310), test mode matrix 340 couples the microprocessor I/O signals on bus 350 to bus 380. Core selection matrix 454 then couples bus 380 to bus 452 in response to input 492 being in the first state (corresponding to core 310), causing all the microprocessor I/O signals for microprocessor core 310 (i.e., on bus 350) to be accessible off-chip. In this manner, an external tester coupled to I/O circuits 430 may apply standard test vectors developed for a stand-alone microprocessor to test microprocessor core 310 within ASIC 300. Microprocessor core 410 may be tested in similar fashion in AVP mode by asserting AVP, de-asserting ICE, and placing core select in a second state corresponding to core 410. In this mode, test mode matrix 440 couples microprocessor I/O signals on bus 450 to bus 480. Core selection matrix 454 then couples bus 480 to bus 452 in response to input 492 being in the second state corresponding to core 410, making all the microprocessor I/O signals for microprocessor core 410 (i.e., on bus 450) available off-chip, thereby allowing for testing microprocessor core 410 with standard test vectors. Thus, in AVP mode, microprocessor cores 310 and 410 may be tested by selecting the appropriate core with the CORE_SELECT control signal, and by applying appropriate test vectors (e.g., AVPs) to I/O circuits 430.

In ICE more, an external in-circuit emulator (ICE) may be coupled to I/O circuits 430 to emulate one of the embedded microprocessor cores 310 and 410. In ICE mode with microprocessor core 310 selected (e.g., when AVP is de-asserted, ICE is asserted, and CORE_SELECT is in the first state, corresponding to microprocessor core 310), test mode matrix 340 couples the I/O signals on bus 360 to bus 380. Core selection matrix then couples bus 380 to bus 452 in response to input 492 being in the first state (corresponding to microprocessor core 310). In normal mode, bus 360 provides microprocessor I/O from microprocessor core 310 on bus 350 to application-specific logic 320. Coupling bus 380 to bus 360 necessarily implies that signals on bus 370 which are normally connected off-chip via bus 380 in normal mode are not available off-chip in ICE mode. As described above, the impact of signals on bus 370 being unavailable in ICE mode may be minimized by judicious selection of which signals within application-specific logic 320 are coupled to bus 370. An ICE may also be used to emulate the function of microprocessor core 410 by de-asserting AVP, asserting ICE, and placing CORE_SELECT in the second state (corresponding to microprocessor core 410). In this mode, test mode matrix 440 couples bus 470 to bus 480. Core selection matrix 454 then couples bus 480 to bus 452 in response to input 492 being in the second state (corresponding to microprocessor core 410), allowing an external ICE coupled to I/O circuits 430 to emulate the functions of microprocessor core 410 on bus 470. Thus, in ICE mode, an external ICE may replace one of the embedded microprocessor cores 310 and 410 by selecting the appropriate core via the CORE_SELECT control signal.

Figure 5:
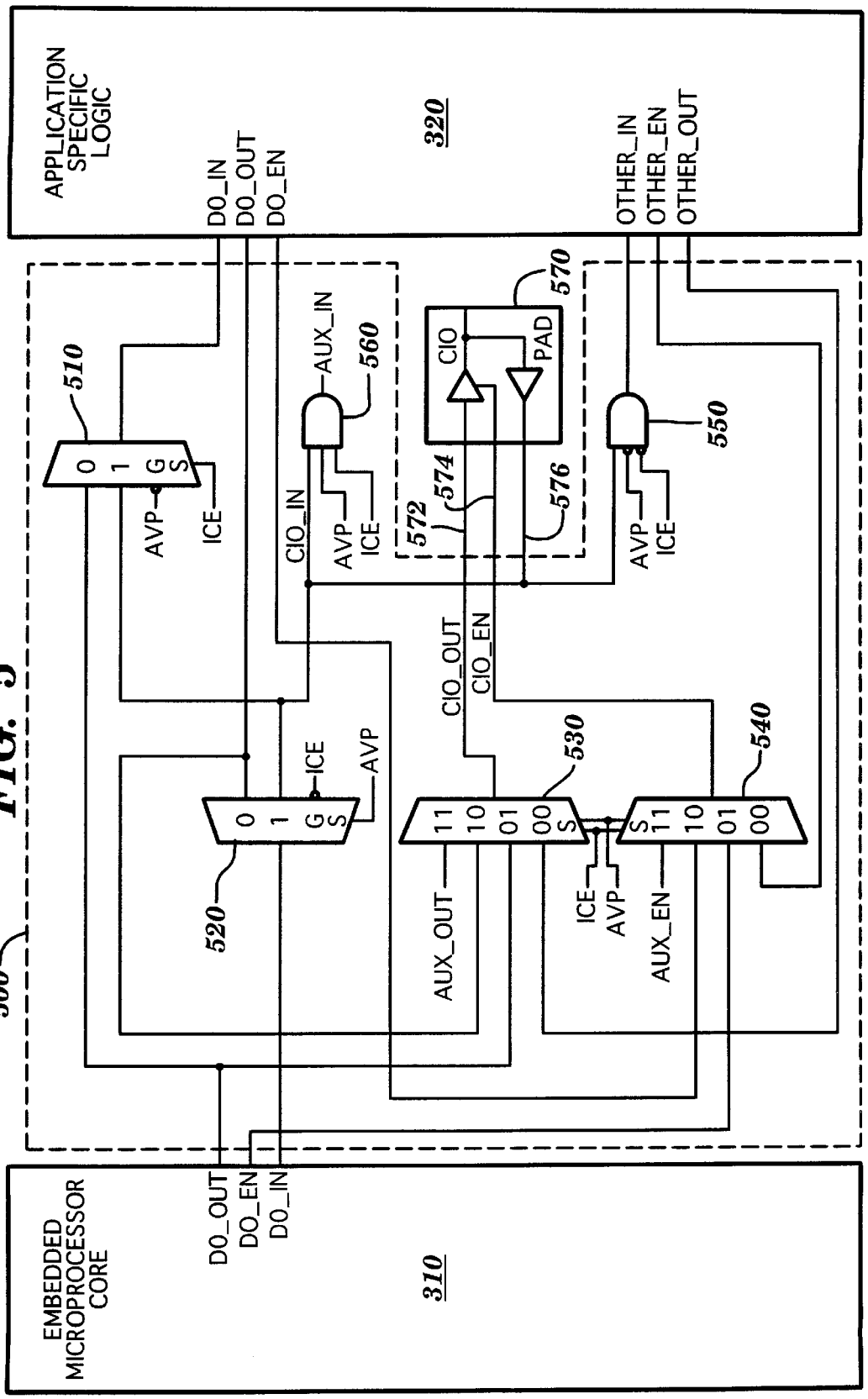
FIG. 5 is a block diagram of a non-dedicated cell used within the test mode matrices of FIGS. 3 and 4.
Figure 6:
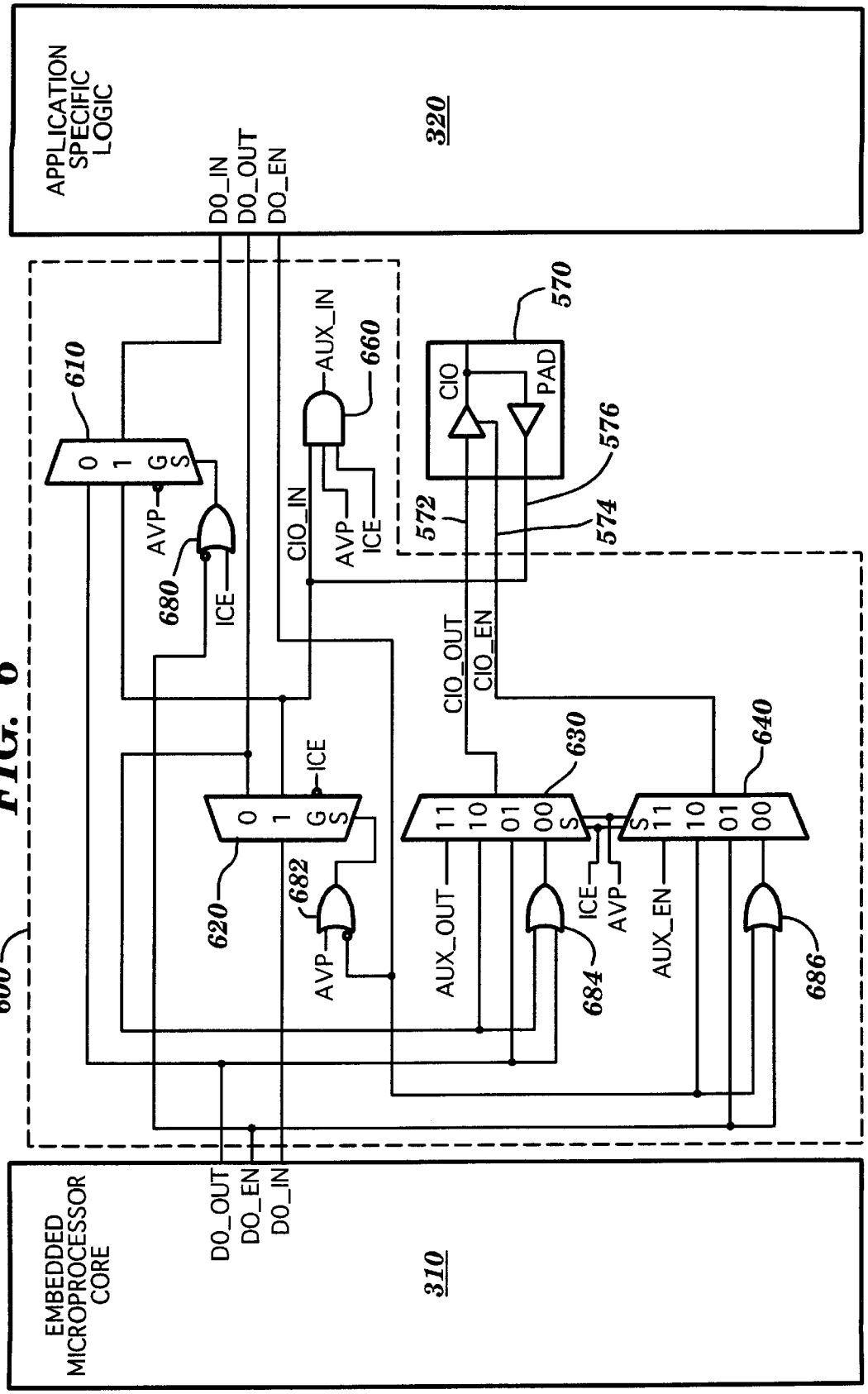
FIG. 6 is a block diagram of a dedicated cell used within the test mode matrices of FIGS. 3 and 4.

The test mode matrix (e.g., 340 and 440) in accordance with the present invention may be implemented using a variety of different internal circuit configurations. Referring to FIG. 5, one suitable circuit is a non-dedicated cell 500 which provides the microprocessor I/O signals to the I/O circuits (e.g., pad 570) only during a test mode (e.g., AVP, ICE, or other test modes). Non-dedicated cells 500 are suitably used for each I/O signal that is accessed externally (e.g, at pad 570) only during a test mode. Referring to FIG. 6, another suitable circuit is a dedicated cell 600 which provides the microprocessor I/O signals to the I/O circuits (e.g., pad 570) in normal mode as well as in the test modes. Dedicated cell 600 is used for each I/O signal that must be externally accessible (e.g., at pad 570) in the normal mode of operation as well as in the test modes. Cell 600 is "dedicated" in that the connection to and from microprocessor I/O to pad 570 is maintained in normal mode rather than just in test modes, as is the case for the non-dedicated cell of FIG. 5, making the output pad "dedicated" to the microprocessor I/O signal.

Referring to FIG. 5, non-dedicated cell 500 is a portion of test mode matrix 340 (FIGS. 3 and 4) interposed between microprocessor core 310 and application-specific logic 320, and is coupled to a pad 570 that has a data output 572, an output enable 574, and a data input 576. Pad 570 corresponds to one specific I/O circuit within I/O circuits 330 or 430. Cell 500 implements the connections required for a single bidirectional signal to/from microprocessor core 310 from/to application-specific logic 320 when the signal is needed at pad 570 only during test modes (i.e., AVP, ICE, and possibly other modes). For illustrative purposes, the bidirectional signal shown in FIG. 5 is the D0 (data bit 0) signal of microprocessor core 310 of FIGS. 3 and 4, which comprises a D0_OUT signal (D0 output), a D0_IN signal (D0 input), and a D0_EN signal (D0 enable). D0_EN of core 310 is asserted (i.e., driven high) by core 310 to indicate that core 310 is driving valid data on its D0_OUT output. Similarly, D0_EN of logic 320 is driven high by logic 320 when it has valid data on its D0_OUT output.

Non-dedicated cell 500 suitably includes multiplexers (MUXs) 510, 520, 530 and 540, and gates 550 and 560. MUXs 510 and 520 are suitable 2-to-1 MUXs with an output that is de-asserted (e.g., driven low) when an enable (G) input is de-asserted (e.g., high). MUXs 510 and 520 route the signal on the 0 input to the output when the select S is low and the enable G is asserted (e.g., low). MUXs 510 and 520 route the signal on the 1 input to the output when the select S is high and the enable G is asserted. MUXs 510 and 520 have their outputs in a de-asserted state (e.g., driven low) when enable G is high. In addition, MUXs 530 and 540 are suitable 4-to-1 MUXs, routing input 00 to the output when select lines S are 00, routing input 01 to the output when select lines S are 01, routing input 10 to the output when the select lines S are 10, and routing input 11 to the output when select lines S are 11.

The function of cell 500 may best be understood by analyzing the signals and effects during each mode of operation (i.e., normal mode, AVP mode, ICE mode, and other modes). In normal mode, AVP and ICE are both de-asserted, i.e., AVP and ICE are both low for cell 500 of FIG. 5. With both AVP and ICE low, MUX 510 is enabled by the AVP low signal, and input 0 is selected by the ICE low signal. As a result, MUX 510 routes D0_OUT from microprocessor core 310 to D0_IN of application-specific logic 320. MUX 520 is also enabled (ICE low), and input 0 is selected (AVP low), causing MUX 520 to route D0_OUT from application-specific logic 320 to D0_IN of microprocessor core 310. ID addition, with both AVP and ICE low, MUX 530 routes OTHER_OUT from application-specific logic 320 to CIO_OUT which is coupled to data output 572 of pad 570. MUX 540 routes OTHER_EN from application-specific logic 320 to CIO_EN, which is coupled to output enable 574 of pad 570. In addition, with AVP and ICE both low, the output AUX_IN of gate 560 is low, while gate 550 passes through data input 576 from pad 570 to the OTHER_IN input to application-specific logic 320. Thus, normal mode results in the following connections:
1) D0_OUT of core 310 to D0_IN of logic 320
2) D0_OUT of logic 320 to D0_IN of core 310
3) OTHER_OUT of logic 320 to data output 572 of pad 570
4) OTHER_EN of logic 320 to output enable 574 of pad 570
5) data input 576 of pad 570 to OTHER_IN of logic 320
Normal mode thus results in the direct coupling of data lines between core 310 and logic 320, without passing through any off-chip driver/receivers, and without passing through any three-state devices. In addition, normal mode couples pad 570 to/from other I/O in logic 320.

In AVP mode, AVP is asserted (i.e., high) and ICE is de-asserted (i.e., low). With AVP high and ICE low, MUX 510 is disabled by the AVP high signal, placing the D0_IN input to application-specific logic 320 in a de-asserted state (e.g., low). MUX 520 is enabled (with ICE low), and input 1 is selected (with AVP high), causing MUX 520 to route the data input 576 from pad 570 to D0_IN of microprocessor core 310. In addition, with AVP high and ICE low, MUX 530 routes D0_OUT from microprocessor core 310 CIO_OUT, which is coupled to data output 572 of pad 570. MUX 540 routes D0_EN from microprocessor core 310 to CIO_EN, which is coupled to output enable 574 of pad 570. In addition, with AVP high and ICE low, the outputs of gates 550 and 560 are both driven low. Thus, AVP mode results in the following connections:
1) data input 576 of pad 570 to D0_IN of core 310
2) D0_OUT of core 310 to data output 572 of pad 570
3) D0_EN of core 310 to output enable 574 of pad 570
AVP mode therefore results in directly coupling the microprocessor I/O signals to pad 570, allowing an external tester to apply test vectors to core 310.

In ICE mode, AVP is de-asserted (i.e., low) and ICE is asserted (i.e., high). With AVP low and ICE high, MUX 510 is enabled (with AVP low) and input 1 is selected (with ICE high), causing MUX 510 to route data input 576 of pad 570 to the D0_IN input to application-specific logic 320. MUX 520 is disabled by the ICE high signal, placing the D0_IN input to microprocessor core 310 in a de-asserted state (e.g., low). In addition, with AVP low and ICE high, MUX 530 routes D0_OUT from application-specific logic 320 to CIO_OUT, which is coupled to data output 572 of pad 570. MUX 540 routes D0_EN from application-specific logic 320 to CIO_EN, which is coupled to output enable 574 of pad 570. In addition, with AVP low and ICE high, the outputs of gates 550 and 560 are both driven low. Thus, ICE mode results in the following connections:
1) data input 576 of pad 570 to D0_IN of logic 320
2) D0_OUT of logic 320 to data output 572 of pad 570
3) D0_EN of logic 320 to output enable 574 of pad 570
ICE mode therefore results in directly coupling I/O signals from logic 320 to pad 570, allowing an external ICE to emulate core 310.

In a fourth mode, with both AVP and ICE high, MUXs 510 and 520 are both disabled, causing the D0_IN input of application-specific logic 320 and the D0_IN input to microprocessor core 310 to be in a de-asserted state (e.g., low). MUX 530 routes signal AUX_OUT to CIO_OUT, which is coupled to data output 572 of pad 570. MUX 540 routes signal AUX_EN to CIO_EN, which is coupled to output enable 574 of pad 570. In addition, with AVP and ICE both high, the output of gate 550 is driven low, and the output of gate 560 (AUX_IN) is the same logic state as CIO_IN from data input 576 of pad 570. This fourth mode thus allows other signals (e.g., AUX) within the ASIC to be available at pad 570. One example of such a fourth mode would allow scan testing of the ASIC during manufacturing by coupling a scan data input signal to AUX_IN and by coupling AUX_EN to a pull-down, or by coupling a scan data output signal to AUX_OUT and by coupling AUX_EN to a pull-up.

Note that subsets of cell 500 may be used for unidirectional input or output signals. Cell 500 may be repeated as required, and various cells 500 may share internal physical structures to minimize the chip area required for test mode matrix 340.

Referring now to FIG. 6, dedicated cell 600 is a portion of test mode matrix 340 interposed between microprocessor core 310 and application-specific logic 320, and is also coupled to pad 570. Cell 600 implements the connections required for a single bidirectional signal to/from microprocessor core 310 from/to application-specific logic 320 when the microprocessor I/O signal is needed at pad 570 during both normal mode and test modes. For illustrative purposes, the bidirectional signal shown in FIG. 6 is the same D0 (data bit 0) signal of microprocessor core 310 shown in FIG. 5. Dedicated cell 600 suitably includes multiplexers (MUXs) 610, 620, 630 and 640, and gates 660, 680, 682, 684 and 686. The function of dedicated cell 600 is identical to the function of non-dedicated cell 500 in AVP, ICE and other modes, but is different in normal mode. The difference between non-dedicated cell 500 and dedicated cell 600 may best be understood by analyzing the signals and effects of cell 600 during normal mode.

In normal mode, AVP and ICE are both de-asserted, i.e., low. With both AVP and ICE low, MUX 610 is enabled by the AVP low signal. The select input to MUX 610 is coupled to the output of gate 680. Thus, with ICE low, when the D0_EN output of microprocessor core 310 is high, the output of gate 680 is low, causing MUX 610 to route the D0_OUT signal from microprocessor core 310 to the input D0_IN input of application-specific logic 320. When the D0_EN output of core 310 goes low, however, the output of gate 680 is high, causing MUX 610 to route the CIO_IN signal from pad 570 to the D0_IN input of application-specific logic 320.

With ICE low in normal mode, MUX 620 is also enabled. The output of gate 682 drives the select line of MUX 620. With AVP low, when the D0_EN output of application-specific logic 320 is high the output of gate 682 is low, causing MUX 620 to route the D0_OUT signal from application-specific logic 320 to the D0_IN input of microprocessor core 310. When the D0_EN output goes low, however, the output of gate 682 goes high, causing MUX 620 to route the CIO_IN signal from data input 576 of pad 570 to the D0_IN input of microprocessor core 310.

With AVP and ICE both low in normal mode, MUXs 630 and 640 both route their 00 inputs to their respective outputs. The 00 input of MUX 630 is the output of OR gate 684. The inputs to OR gate 684 are D0_OUT from microprocessor core 310 and D0_OUT from application-specific logic 320. It is assumed that D0_OUT of either core 310 or logic 320 is held low when the corresponding D0_EN is inactive. Thus, when D0_OUT from either of core 310 or logic 320 goes high, the output of MUX 630 (CIO_OUT) goes high, driving data output 572 of pad 570 high. In similar fashion, when either of the D0_EN signals from core 310 or logic 320 is high, the output of MUX 640 (CIO_EN) also goes high, driving output enable 574 of pad 570 high. In addition, with AVP and ICE both low, the output of gate 660 is driven low, resulting in a low signal on AUX_IN. Thus, normal mode results in the following connections:
1) data input 576 of pad 570 to D0_IN of logic 320 when D0_EN of core 310 is low
2) D0_OUT of core 310 to D0_IN of logic 320 when D0_EN of core 310 is high
3) data input 576 of pad 570 to D0_IN of core 310 when D0_EN of logic 320 is low
4) D0_OUT of logic 320 to D0_IN of core 310 when D0_EN of logic 320 is high
5) high on data output 572 of pad 570 when either D0_OUT of core 310 or D0_OUT of logic 320 is high
6) high on output enable 574 of pad 570 when either D0_EN of core 310 or D0_EN of logic 320 is high As stated above, the connections for AVP mode, ICE mode, and other modes are identical to the connections for non-dedicated cell 500 in FIG. 5.

Referring again to FIG. 4, test mode matrix 340 suitably comprises a combination of non-dedicated cells 500 and dedicated cells 600, while test mode matrix 440 suitably comprises only dedicated cells 600. Note that cells 500 and 600 described herein and illustrated in the figures assume a bidirectional signal consisting of an input, an output, and an enable signal. Cells 500 and 600 may also be used, however, for unidirectional input or output signals, either by driving unused inputs in the basic cells 500 and 600 to a low logic level, or by optimizing a portion of cell 500 or 600 by removing unneeded circuitry.

Figure 7:
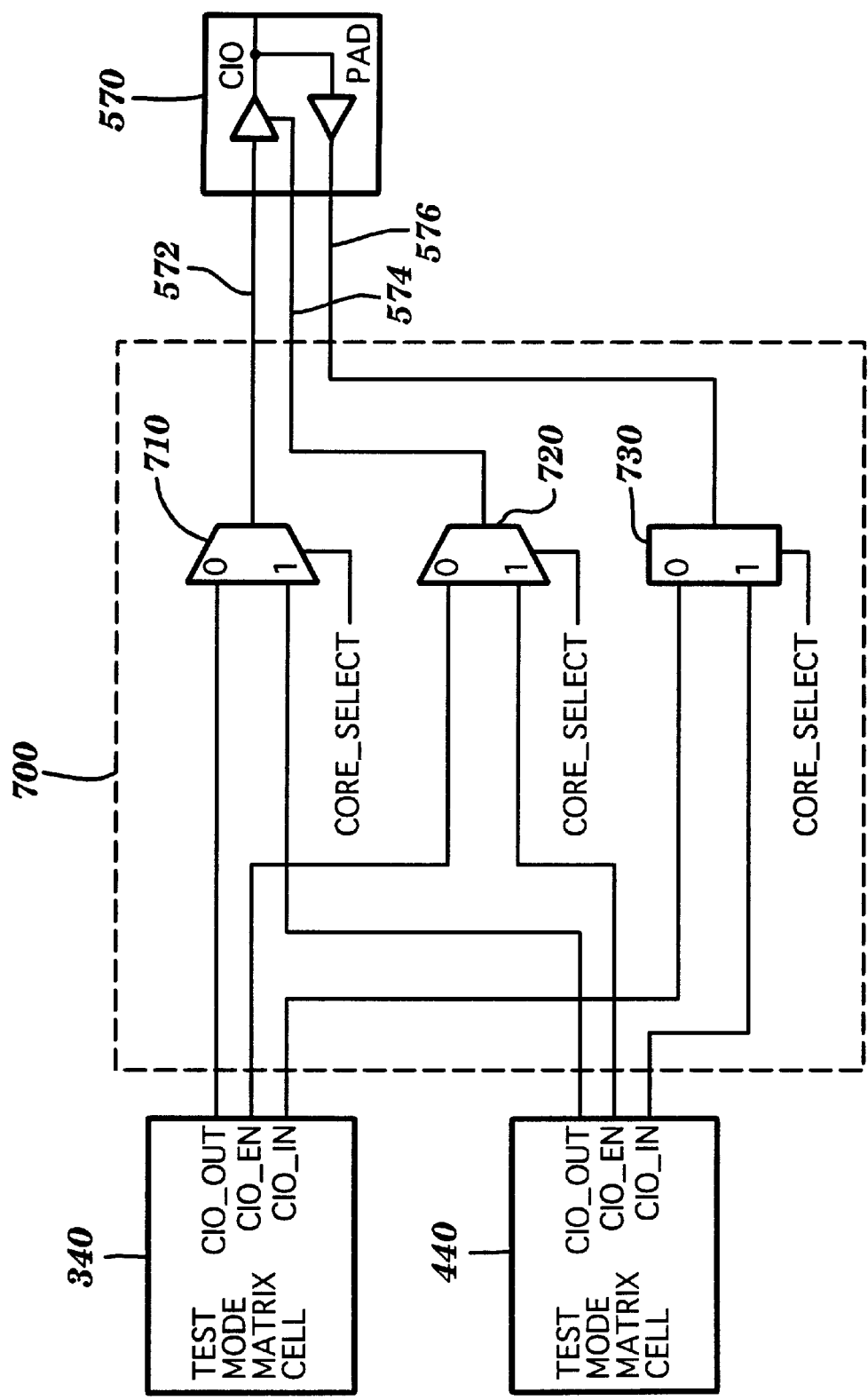
FIG. 7 is a block diagram of a portion of the core selection matrix of FIG. 4.

Referring to FIG. 7, the internal circuitry of core selection matrix 454 (FIG. 4) includes a plurality of cells 700. Each cell 700 includes a data input CIO_IN, a data output CIO_OUT, and an enable input CIO_EN from a first test mode matrix (e.g., 340), the same three signals from a second test mode matrix (e.g., 440), and corresponding outputs to pad 570. Cell 700 includes MUXs 710 and 720, and decoder 730. MUXs 710 and 720 couple input 0 to their outputs when CORE_SELECT is low, and couples input 1 to their outputs when CORE_SELECT is high. Decoder 730 couples its input signal to its output 0 when CORE_SELECT is low, and couples its input to its output 1 when CORE_SELECT is high. MUX 710 is a data output multiplexer, MUX 720 is an output enable multiplexer, and MUX 730 is a data input decoder. MUXs 710 and 720, and decoder 730, selectively couple the signals from test mode matrix 340 to pad 570 when CORE_SELECT is in the first state (e.g., low, corresponding to microprocessor core 310), and selectively couple the signal from test mode matrix 440 to pad 570 when core select is in a second state (e.g., high, corresponding to microprocessor core 410).

While cell 700 is shown for illustrative purposes with circuitry to switch between two test mode matrices 340 and 440, it is within the scope of the present invention for cell 700 to switch between any number of embedded microprocessor cores by simply increasing the number of select lines that comprise the CORE_SELECT signal (and corresponding inputs 492), and increasing the number of inputs to MUXs 710 and 720, and decoder 730, to accommodate the signals from each microprocessor core that are routed through each corresponding test mode matrix.

By eliminating all three-state devices in the integrated circuit (i.e., 300 and 400) in accordance with the present invention, several benefits accrue when compared to integrated circuits that have three-state devices. For example, a three-state bus in high-impedance state can float across the switching threshold of circuits driven by the bus, causing these circuits to toggle rapidly, thereby consuming more power. Having no three-state busses thus reduces the power consumption of the integrated circuit. In addition, tools for generating test patterns do not typically support three-state devices, since only one driver on the three-state bus can be enabled at any given time. To prevent bus contention on a three-state bus during testing, test patterns must be generated by hand, significantly increasing the expense of testing an integrated circuit with three-state devices when compared to a comparable integrated circuit without three-state devices. The most important benefit, however, of eliminating all three-state devices within the integrated circuit of the present invention is that the resulting integrated circuit is 100% testable. All functions of the integrated circuit may be fully functionally tested, without fear that one or more three-state devices are masking defects during testing.

An ASIC in accordance with the present invention containing one or more test mode matrices as disclosed herein provides for complete testability by virtue of allowing each embedded microprocessor core to be fully functionally tested using standard test vectors, by allowing an ICE to emulate the function of any one of the embedded microprocessor cores for debugging purposes, and by providing other test modes as needed, such as scan testing of the ASIC during manufacturing. The performance of the ASIC is also enhanced by directly routing all signals between the microprocessor core and the application-specific logic directly through the test mode matrix or matrices, without passing through off-chip drivers and receivers, and without passing through any three-state devices.

While the invention has been particularly shown and described with reference to a preferred exemplary embodiment thereof it will be understood by those skilled in the art that various changes in form and details may be made therein without departing from the spirit and scope of the invention. In addition, it will be understood that, while various of the conductors or connections are shown in the drawing as single lines, they are not so shown in a limiting sense, and may comprise plural conductors or connections, as is understood in the art.

We claim:

1. An integrated circuit comprising:
   at least one microprocessor;
   a plurality of I/O circuits coupled to a plurality of I/O pads, wherein the plurality of I/O circuits comprise a plurality of I/O drivers and I/O receivers;
   a logic circuit; and
   a switch means coupled between the microprocessor and the logic circuit, wherein the switch means operates in one of a plurality of mutually-exclusive states, and wherein the switch means routes the microprocessor operational signals to the logic circuit without passing through any I/O drivers that are coupled to I/O pads on the integrated circuit and without passing through any I/O receivers that are coupled to the I/O pads in a first of the plurality of states, routes the microprocessor test signals from the plurality of I/O circuits to the microprocessor in a second of the plurality of states, and routes the logic test signals from the plurality of I/O circuits to the logic circuit in a third of the plurality of states.

2. The integrated circuit of claim 1 wherein the switch means contains no three-state devices.

3. The integrated circuit of claim 1 further comprising means for selecting one of the plurality of states.

4. The integrated circuit of claim 1 wherein the first state of the switch means corresponds to a state for normally operating the integrated circuit, wherein the second state of the switch means corresponds to a state for testing the microprocessor by applying standard test vectors for the microprocessor to the plurality of I/O pads, and wherein the third state of the switch means corresponds to a state for testing the integrated circuit by coupling an in-circuit emulator to the plurality of I/O pads.

5. The integrated circuit of claim 1 wherein the switch means comprises at least one test mode matrix, each test mode matrix comprising a plurality of cells, each cell coupled to at least one of the plurality of I/O circuits, each cell further comprising:
   means for coupling at least one signal between the microprocessor and the logic circuit in the first state;
   means for coupling at least one signal between at least one of the plurality of I/O circuits and the microprocessor in the second state; and
   means for coupling at least one signal between at least one of the plurality of I/O circuits and the logic circuit in the third state.

6. The integrated circuit of claim 1 wherein the switch means routes auxiliary test signals from the integrated circuit to the plurality of I/O circuits when the signal routing means is in a fourth state.

7. The integrated circuit of claim 1 comprising a plurality of microprocessors, and further comprising a means for selecting one of the plurality of microprocessors.

8. The integrated circuit of claim 1 comprising a plurality of microprocessors, and wherein the switch means comprises:
   a plurality of test mode matrices, at least one test mode matrix for each of the microprocessors; and
   a means for coupling the test mode matrices corresponding to a selected one of the plurality of microprocessors to the plurality of I/O circuits.

9. A method for testing an integrated circuit comprising the steps of:
   providing a microprocessor on the integrated circuit;

providing a logic circuit on the integrated circuit;

providing a plurality of I/O circuits on the integrated circuit that are coupled to a plurality of I/O pads on the integrated circuit, wherein the plurality of I/O circuits comprise a plurality of I/O drivers and I/O receivers;

providing switch means coupled between the microprocessor and the logic circuit, wherein the switch means operates in one of a plurality of mutually-exclusive states, and wherein the switch means routes microprocessor operational signals directly to the logic circuit without passing through any I/O circuits in a first of the plurality of states, routes microprocessor test signals to the microprocessor in a second of the plurality of states, and routes logic test signals to the logic circuit in a third of the plurality of states;

routing the microprocessor test signals from an external tester that is coupled to at least one I/O pad; and applying test vectors to the microprocessor through the switch means.

10. The method of claim 9 further comprising the step of the switch means routing the logic test signals from an external in-circuit emulator which emulates the function of the microprocessor for debugging the logic circuit and for debugging code for the microprocessor.

* * * * *